Dec. 1, 1970 W. B. HARRIS 3,544,818

THYRISTOR SWITCH CIRCUIT

Filed Dec. 26, 1967

INVENTOR
W. B. HARRIS
BY
B. J. Stoddard
ATTORNEY 3,544,818
Patented Dec. 1, 1970

3,544,818

THYRISTOR SWITCH CIRCUIT

William B. Harris, Bernardsville, N.J., assignor to Bell Telephone Laboratories, Incorporated, Murray Hill and Berkeley Heights, N.J., a corporation of New York Filed Dec. 26, 1967, Ser. No. 693,272
Int. Cl. H03k 3/335, 3/26
U.S. Cl. 307—284 12 Claims

ABSTRACT OF THE DISCLOSURE

Heretofore, when a thyristor switch circuit has employed a resonant circuit, including a series connected inductor and capacitor, for turning off the thyristor, the minimum pulse width that could be obtained was usually greater than twice the recovery time of the thyristor. It has now been discovered that an approximately 30 percent reduction in this minimum pulse width can be effected by connecting a second inductor in series with the first-mentioned inductor. This second inductor is selected to have an inductance value which is different from that of the first inductor. A diode is connected in parallel with that one of the inductors which has the larger inductance value. The diode is so poled as to provide a shunt path across the larger inductor only during the initial portion of a pulse. This provides a greater ratio of turn-off time to pulse width and thereby produces a narrower pulse for a given turn-off time.

BACKGROUND OF THE INVENTION

This invention relates to improved semiconductor switch circuits capable of operating at rapid speeds in high power circuits for producing rectangular pulses, and, more particularly, to means for reducing the on-off time interval of a semiconductor switching circuit in order to produce narrower pulses.

Semiconductor switches of the prior art have used a variety of semiconductor devices. The semiconductor devices most commonly used in switch circuits are four-layer PNPN devices known as silicon controlled rectifiers or thyristors. As is well known, a PNPN device is usually provided with three terminals and has properties somewhat analogous to a gas-filled thyratron and, like the thyratron, once it is switched on, it remains conductive until a turn-off mechanism is operated. Although the operating speed of the thyristor is inherently much greater than that of the thyratron, some utilization circuits require faster operating speeds than those for which a thyristor is inherently capable.

The need for faster operating speeds has been met by a prior art thyristor switch circuit which is disclosed and claimed in a copending patent application filed by W. B. Harris, R. P. Massey, and F. J. Zgebura. This prior application, bearing Ser. No. 537,544, was filed on Mar. 25, 1966, and is now Pat. No. 3,404,293 which is assigned to the same assignee as the present application. The circuit of this copending application is described in detail hereinafter with reference to FIG. 1 of the drawing wherein it can be seen that the switch circuit employs a single thyristor and a simple resonant turn-off circuit comprising a series connected inductor and capacitor. An impedance is connected between the gate and cathode of the thyristor to reduce false triggering from the rate effect. Both the rate effect and the turn-off capabilities are improved by connecting a diode between the gate and cathode of the thyristor, and another diode between the gate and anode of the thyristor. These diodes, which may be called reverse current diodes, are so constructed that the reverse recovery time of the middle junction in the thyristor is less than that of the first diode and greater than that of the second diode.

Although this prior art circuit has made it possible to reduce the turn-off time of a thyristor switch to one-half or less of its inherent turn-off time, it is not fully satisfactory for all purposes. The reason for this is that technological advances have developed increasing needs for still faster switching circuits. The chief obstacle to meeting these needs has resided in the restricted minimum pulse width obtainable from a thyristor having a given on-off, or recovery, time. For example, in this prior art circuit, the minimum pulse width obtainable is usually somewhat greater than twice the recovery time of the thyristor. It can therefore be understood that the principal barrier which has prevented increasing the operating speed of a thyristor switch circuit has been the inherent recovery time of the thyristor. Thus, there is a need for means for reducing the recovery, or on-off time interval of a thyristor switch circuit so as to produce narrower pulses.

SUMMARY OF THE INVENTION

The present invention is designed to increase the operating speed of a thyristor switch circuit by modifying the above-mentioned prior art circuit in such a manner as to effect an approximately 30 percent reduction in the minimum pulse width. This is accomplished by connecting a second inductor in series with the above-mentioned inductor in the resonant turn-off circuit. This second inductor is selected to have an inductance value which is different from that of the first inductor. A diode is connected in parallel with that one of the inductors which has the larger inductance value. The diode is so poled as to provide a shunt path across the larger inductor only during the initial portion of a pulse. This provides a greater ratio of turn-off time to pulse width and thereby produces a narrower pulse for a given turn-off time.

BRIEF DESCRIPTION OF THE DRAWING

The features of this invention are fully discussed hereinafter in relation to the following detailed description of the drawing in which.

DETAILED DESCRIPTION

Figures 1, 2, 3, 4, 5, 6:
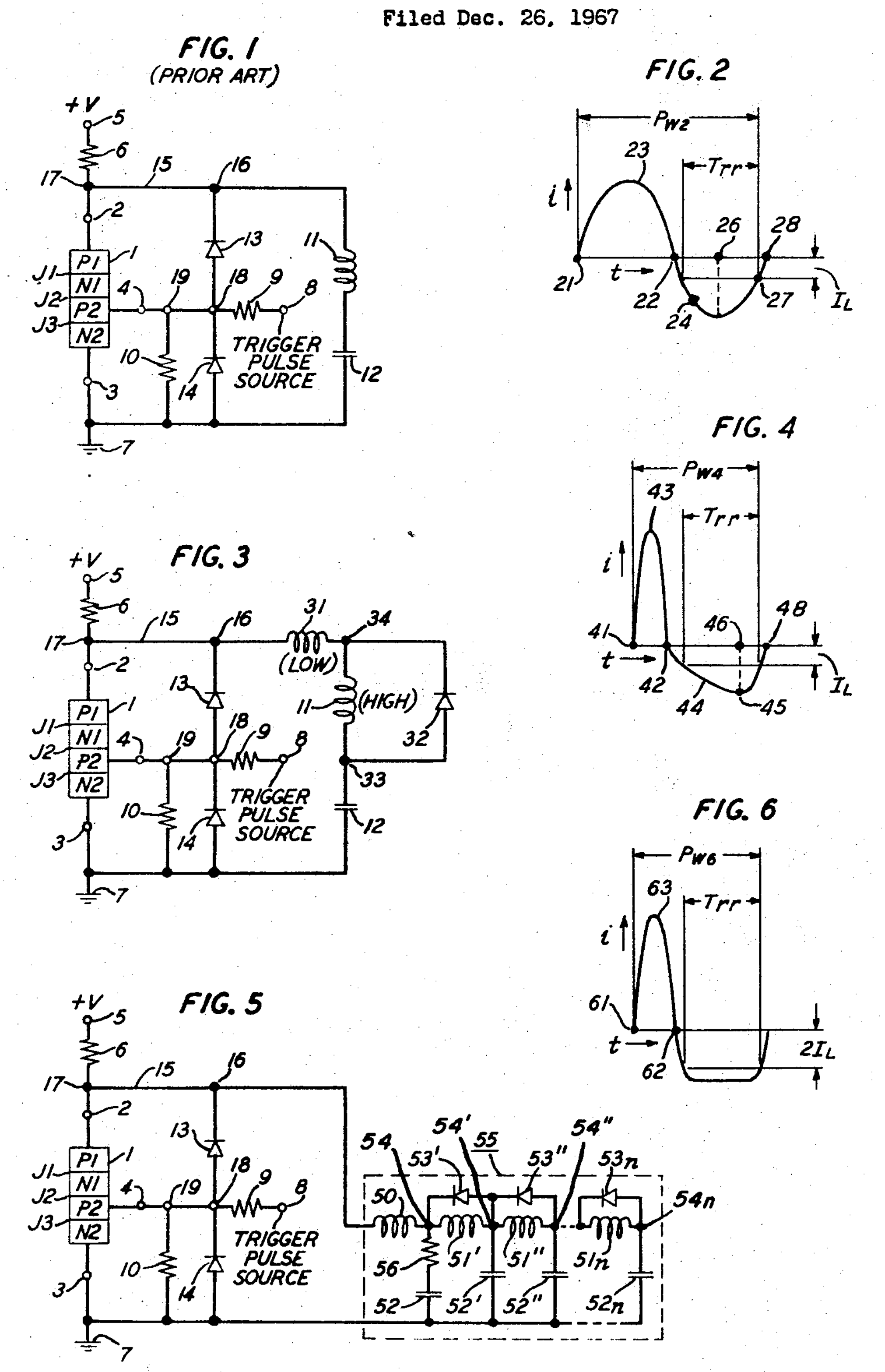
FIG. 1 (PRIOR ART), FIG. 2, FIG. 3, FIG. 4, FIG. 5, FIG. 6
FIG. 1 discloses the thyristor switch circuit of the above-mentioned copending application.
FIG. 2 is a diagram illustrating the manner in which the width of a pulse produced by the thyristor switch circuit of FIG. 1 is determined by the relationship between the turn-off current and the recovery time of the thyristor.
FIG. 3 shows the circuit of FIG. 1 modified in accordance with the present invention for generating a different turn-off current which is utilized to produce narrower pulses.
FIG. 4 is a diagram depicting a narrower pulse that is obtained by using one cycle of the turn-off current generated by the circuit of FIG. 3.
FIG. 5 shows the circuit of FIG. 3 modified with the addition of a pulse forming network for use with high load currents.
FIG. 6 is a diagram representing the shortening of a pulse resulting from the use of one cycle of the turn-off current produced by the circuit of FIG. 5.

The switch circuit of the above-mentioned copending patent application is shown in FIG. 1 as utilizing a single thyristor 1 comprising four layers having regions P1, N1, P2, and N2 with junctions J1, J2, and J3 between them. The thyristor 1 is provided with an anode terminal 2 connected to the upper outer layer P1, a cathode terminal 3 connected to the lower outer layer N2, and a gate terminal 4 connected to the lower intermediate layer P2. A power supply source of direct voltage has its positive side connected to a terminal 5. The terminal 5 is coupled through a utilization circuit, which is represented symbolically by a load resistor 6, to the anode terminal 2. The cathode terminal 3 is connected to a source 7 of ground potential which is to be understood as being connected to the negative side of the source 5 of direct voltage.

The switch circuit further includes a terminal 8 which extends to an external source of trigger pulse current. The treminal 8 is coupled through a resistor 9 and the points 18 and 19 to the gate terminal 4. A resistor 10 is connected between the point 19 and the source 7 of ground potential. As is well known in the art, a positive trigger pulse applied to the terminal 8 will cause current to flow through the divider resistors 9 and 10 thereby producing a potential difference between the gate terminal 4 and the cathode terminal 3. This functions to trigger the thyristor 1 by substantially reducing the impedance between the anode terminal 2 and the cathode terminal 3. The triggering of the thyristor 1 causes current to flow from the source 5 of positive direct voltage, through the load resistor 6, through the anode-cathode path in the thyristor 1 to the ground 7, and then back to the negative side of the direct voltage supply.

At this point, attention should be directed to a resonant turn-off circuit that comprises an inductor 11 and a capacitor 12 which are serially connected across the anode terminal 2 and the cathode terminal 3. Prior to the triggering of the thyristor 1, the capacitor 12 is charged to the same potential as that of the source 5 of direct voltage over a path extending from the resistor 6, along the lead 15, and then through the inductor 11 to the capacitor 12.

When the thyristor 1 is triggered, it becomes conductive and initiates the generation of a pulse across the load resistor 6. Also, at this time, the capacitor 12 discharges and initiates a flow of ringing current. The first half-cycle of this ringing current flows from the capacitor 12 through the inductor 11, over the lead 15, through the thyristor 1 in the forward direction, and then back to the capacitor 12. This first half-cycle of ringing current is represented in FIG. 2 by the reference numeral 23 and has a length or duration extending from the point 21 to the point 22. In FIG. 2, the symbol $i$ signifies the amplitude of the ringing current, $I_L$ represents the load current, $T_{rr}$ is the recovery time of the thyristor 1, and $t$ indicates the time axis.

At the beginning of the second half-cycle, the ringing current reverses in phase and flows through the thyristor 1 in the reverse direction. The values of the capacitor 12 and the inductor 11 are so selected as to cause the magnitude of the reverse ringing current to quickly exceed the magnitude of the normal load current, as is represented at the point 24 in FIG. 2. This produces a net reverse current which flows from the cathode terminal 3, through all three of the junctions J3, J2, and J1, and then to the anode terminal 2.

In order to reduce the time required to restore the forward-blocking capability of the thyristor 1 and also to improve its dynamic breakdown capability, two diodes 13 and 14 are serially connected across the anode terminal 2 and the cathode terminal 3, and are also connected across the inductor 11 and the capacitor 12. It can be seen in FIG. 1 that this connection uses the lead 15 for connecting a point 16 between the inductor 11 and the upper diode 13 to a point 17 between the load resistor 6 and the anode terminal 2. The point 18 between the diodes 13 and 14 is joined to the conductor extending from the gate terminal 4 to the resistor 9 and the source 8 of trigger pulse current.

As is described in the above-mentioned copending application, the lower diode 14 has a reverse recovery time which is longer than the reverse recovery time of the middle junction J2 of the thyristor 1. Conversely, the upper diode 13 has a reverse recovery time which is less than the reverse recovery time of the junction J2. In other words, the reverse recovery time of the middle junction J2 is less than that of the lower diode 14 and is greater than that of the upper diode 13.

It should be noted that at the beginning of the second half-cycle of the ringing current, the ringing current will be a reverse current for the two outer junctions J1 and J3 but will be a forward current for the middle junction J2. Therefore, the slow recovery diode 14 will be momentarily reverse biased by the charge stored in the lower junction J3 while the fast recovery diode 13 will be biased below its threshold voltage by the opposed charges in junctions J1 and J2. This condition of the diodes 13 and 14 permits the reverse ringing current to flow through the thyristor 1 at the start of the second half-cycle.

The flow of reverse ringing current quickly functions to reduce the charge density in junction J3 to zero thereby causing it to recover and open. During the transition in junction J3, current will begin to flow through the lower diode 14 and will increase to the point at which the diode 14 will be carrying all of the reverse ringing current. At this time, the reverse current will flow from the capacitor 12, through the lower diode 14, through the gate terminal 4 and into the middle junction J2, out through the upper junction J1, and then to the inductor 11. Thus, the recovery of the lower junction J3 does not terminate the pulse since the pulse current across the load resistor 6 is maintained because it is superimposed upon the reverse ringing current which is now flowing through the lower diode 14

Since the reverse ringing current is also a reverse current for the upper junction J1, the junction J1 will partially recover during the time that the lower junction J3 is carrying reverse current. After the lower junction J3 fully recovers, the above-described flow of reverse current through the lower diode 14 and the midde junction J2 will force the upper junction J1 to complete its recovery thereby reducing its charge density to zero. In other words, the upper junction J1 is forced to recover due to a forward current flowing through the middle junction J2.

While this change in junction J1 is occurring, the current flowing through junctions J1 and J2 will be reduced toward zero and the current flowing through the fast recovery diode 13 will be correspondingly increased to the limit of the reverse ringing current. This flow of current through the upper diode 13 will cause an additional charge to be stored in the lower diode 14. It should be noted that, since the middle junction J2 had been forward biased, the charge density now existing in this junction J2 is not zero and it begins to recover by recombination. The thyristor 1 is now open at both junctions J1 and J3 and further reverse current is unnecessary except to store more charge in the slow recovery diode 14.

During the latter portion of the second half-cycle of ringing current, the magnitude of the ringing current becomes smaller than the magnitude of the load current as is represented in FIG. 2 at the point 27. Since the reverse recovery time of the upper diode 13 is less than the reverse recovery time of the middle junction J2, the diode 13 recovers and a second forward current is now applied to the thyristor 1. This current flows in the forward direction through the upper junction J1 and in the reverse direction through the middle junction J2 and the lower diode 14. Accordingly, this current forces the middle junction J2 to recover before the diode 14 recovers by recombination. The recovery of the middle junction J2 turns off the thyristor 1 thereby terminating the pulse which, accordingly, has the width $P_{w2}$ that is indicated in FIG. 2. Shortly thereafter, when the diode 14 finally completes its recovery, the switch circuit becomes ready for generating another pulse.

By thus designing diode 14 to recover more slowly than the middle junction J2, gate triggering of the thyristor 1 is prevented as is explained in the abovementioned copending patent application. In addition, this provides a low impedance between the cathode terminal 3 and the gate terminal 4 for a short interval after the thyristor 1 recovers and thus improves the rate effect capability of this switch circuit.

The thyristor switch circuit that is shown in FIG. 3 is somewhat similar to the switch circuit shown in FIG. 1 and employs the same power supply source 5 for providing the same value $I_L$ of load current. Also, since the circuit of FIG. 3 utilizes the same thyristor 1 as is used in the circuit of FIG. 1, the recovery time $T_{rr}$ of the thyristor 1 is the same in both circuits. Therefore, in FIGS. 2 and 4, the portions that are indicatesd by the reference symbols $I_L$ and $T_{rr}$ are identical in both diagrams.

When the circuit of FIG. 3 is compared with the circuit of FIG. 1, it can be seen that a second inductor 31 has been connected between the point 16 and the upper end of the inductor 11. This second inductor 31 has an inductance value that is different from that of the first inductor 11. In this embodiment of the invention, the inductance value of the second inductor 31 is selected to be smaller, or lower, than that of the first inductor 11. It can also be seen that a diode 32 has been added with its anode connected to a point 33 near the lower end of the first inductor 11 while its cathode is connected to a point 34 between the two inductors 11 and 31. Thus, the diode 32 is connected in parallel with the high inductor 11. This diode 32 is preferably selected to have a fast recovery time.

During the idle condition, the capacitor 12 is charged by the positive potential from the power supply source 5 over a path extending through the resistor 6, along the lead 15, and then through the inductors 31 and 11 to the capacitor 12. The capacitor 12 thus acquires a charge approximately equal to the potential of the supply source 5. At this time, there is no potential drop across the diode 32.

When the thyristor 1 is triggered in the manner described above, current from the source 5 will flow through the thyristor 1 to the ground 7. This places the point 16 at ground potential thereby lowering the potential at the point 34 so that the diode 32 will now funcion as a shunt across the high inductor 11. Accordingly, the capacitor 12 will now discharge through the diode 32 and will resonate with the low inductor 31. The resulting ringing current will, at first, flow through the thyristor 1 in the forward direction. As is indicated in FIG. 4, the amplitude of this forward ringing current acquires a high peak 43 during this first half-cycle. It can be seen by inspection of the spacing between the points 41 and 42 in FIG. 4, that the duration of this first half-cycle is appreciably shorter than the duration 21–22 of the first half-cycle 23 shown in FIG. 2.

At the beginning of the second half-cycle, the phase of the ring current is reversed and this current now flows through the thyristor 1 in the reverse direction. Since the diode 32 is poled so as to block the reverse ringing current, this current is now forced to flow through both of the inductors 31 and 11 in series with the capacitance 12. As is illustrated in FIG. 4, this produces a quarter-cycle sine wave 44 having a lower peak amplitude 45. This third quarter-cycle extends in time from the point 42 to the point 46 and, therefore, has a substantially longer duration than the duration 22–26 of the corresponding third quarter-wave shown in FIG. 2.

At the peak 45 of this reverse half-cycle of ringing current, the voltage across the high inductor 11 becomes reversed and current now flows through the diode 32 which thus acts as an instrumentality for establishing a shunt or short circuit across the high inductor 11. This shunting of the high inductor 11 causes the current during the fourth quarter-cycle to fall to the point 48 in FIG. 4 at a faster rate than the corresponding fourth quarter-cycle current shown in FIG. 2 fell to the point 28. It can be seen in FIG. 4 that the duration 46–48 of the fourth quarter-cycle is considerably shorter than the duration 42–46 of the third quarter-cycle. It can also be seen in FIG. 4 that the duration 41–42 of the first half-cycle is much shorter than the duration 42–48 of the second half-cycle.

Thus, assuming that the switch circuit of FIG. 3 employs the same load current $I_L$ and thyristor recovery time $T_{rr}$ as the circuit of FIG. 1, the circuit of FIG. 3 will provide a greater ratio of turn-off time to pulse width and will thereby produce a pulse width $P_{w4}$ which is approximately 30 percent shorter than the pulse width $P_{w2}$ that is obtained from the circuit of FIG. 1.

When the thyristor switch circuit of this invention is used with high load currents, such as a load current having the value $2I_L$ which is twice the value of the load current $I_L$ used in the circuits of FIGS. 1 and 3, it is preferable to modify the circuit of FIG. 3 by adding a pulse forming network 55 as is shown in FIG. 5. This pulse forming network 55 comprises a low inductor 50 connected in series with a number of high inductors 51′, 51″, and 51$_n$. The network also includes a capacitor 52 which is coupled by a resistor 56 to a point 54 between the inductors 50 and 51′. A capacitor 52, is connected to a point 54′ between the inductors 51′ and 51″, another capacitor 52″ is connected to a point 54″ between the inductors 51″ and 51$_n$, and another capacitor 52$_n$ is connected to a point 54$_n$ at one end of the inductor 51$_n$. Each of the high inductors 51′, 51″, and 51$_n$ is bridged by a respectively different shunt circuit containing a diode 53′, 53″, and 53$_n$, respectively.

This circuit construction, in effect, constitutes a series or chain of circuits based on the same principle as the network shown in FIG. 3; namely, a resonant circuit containing a capacitor in series with a low inductor and a high inductor, and having a diode for shunting the high inductor during the first half-cycle of the ringing current. Thus, as is represented in FIG. 6, the first half-cycle of the ringing current has an amplitude 63 which forms a high peak and has a duration 61–62 which is appreciably less than the duration 21–22 of the first half-cycle 23 of ringing current shown in FIG. 2. This results in the production of a pulse having a width $P_{w6}$ which is approximately 30 percent shorter than the pulse width $P_{w2}$ that is obtained from the circuit of FIG. 1.

It should be noted that, if it is desired to terminate the load pulse abruptly so as to obtain a faster fall time, this can be accomplished by employing a suitable pulse terminating circuit incorporating another thyristor in a manner well known to those skilled in the art.

What is claimed is:

1. A switch circuit having a thyristor adapted for generating a pulse of electric energy, said switch circuit comprising a resonant turn-off circuit including a serially connected capacitor and inductor adapted for producing at least one cycle of ringing current for turning off said thyristor for effecting the termination of the generation of said pulse, said cycle of ringing current comprising a first half-cycle and a second half-cycle, said switch circuit being characterized in that it further comprises means for making the duration of said first half-cycle of ringing current shorter than the duration of said second half-cycle of ringing current for thereby reducing the width of said pulse, said means including a second inductor connected in series with said first-mentioned inductor, and said second inductor having an inductance value that is different from the inductance value of said first-mentioned inductor.

2. A switch circuit in accordance with claim 1 and further comprising a shunt circuit connected in parallel with one of said inductors, and means connected in said shunt circuit for in effect alternatively opening and closing said shunt circuit for alternatively shunting said inductor.

3. A switch circuit in accordance with claim 2 wherein said last-mentioned means include a diode.

4. A switch circuit in accordance with claim 2 wherein said shunt circuit is connected in parallel with that one of said inductors having the larger inductance value.

5. A switch circuit adapted for generating a pulse of electric energy, said switch circuit comprising a source of electric power, a normally nonconductive thyristor having anode and cathode terminals, a utilization circuit coupling said source of electric power to said anode terminal, starting means adapted for triggering said thyristor for rendering it conductive whereby a pulse is generated across said utilization circuit, said starting means including a gate terminal connected to said thyristor and adapted to receive electric energy for triggering said thyristor, and a resonant turn-off circuit adapted for producing a cycle of ringing current for turning off said thyristor for effecting the termination of the generation of said pulse, said cycle of ringing current comprising four quarter-cycles including a third quarter-cycle and a fourth quarter cycle, said turn-off circuit having one side connected to said anode terminal and another side connected to said cathode terminal, said turn-off circuit including a serially connected inductor and capacitor, said switch circuit being characterized in that it further comprises means for making the duration of said fourth quarter-cycle of ringing current shorter than the duration of said third quarter-cycle of ringing current, said last-mentioned means including a second inductor connected in series with said first-mentioned inductor, said second inductor having an inductance value that is different from the inductance value of said first-mentioned inductor, and means for shunting one of said inductors during said fourth quarter-cycle of ringing current.

6. A switch circuit adapted for generating a pulse of electric energy, said switch circuit comprising a source of electric power, a normally nonconductive thyristor having anode and cathode terminals, a utilization circuit coupling said source of electric power to said anode terminal, starting means adapted for triggering said thyristor for rendering it conductive whereby a pulse is generated across said utilization circuit, said starting means including a gate terminal connected to said thyristor and adapted to receive electric energy for triggering said thyristor, and a resonant turn-off circuit adapted for producing a cycle of ringing current for turning off said thyristor for effecting the termination of the generation of said pulse, said cycle of ringing current comprising a first half-cycle and a second half-cycle, said turn-off circuit having one side connected to said anode terminal and another side connected to said cathode terminal, said turn-off circuit including a serially connected inductor and capacitor, said switch circuit being characterized in that it further comprises means for reducing the width of said pulse, said last-mentioned means including a second inductor connected in series with said first-mentioned inductor, said second inductor having an inductance value that is different from the inductance value of said first-mentioned inductor, and said switch circuit further comprising means for shunting a selected one of said inductors during the second half-cycle of said ringing current.

7. A switch circuit in accordance with claim 6 wherein said last-mentioned means include a diode connected in parallel with said selected one of said inductors.

8. A switch circuit in accordance with claim 6 wherein said selected one of said inductors is that one of said inductors having the larger inductance value.

9. A switch circuit adapted for generating a pulse of electric energy, said switch circuit comprising a source of electric power, a normally nonconductive thyristor having anode and cathode terminals, a utilization circuit coupling said source of electric power to said anode terminal, starting means adapted for triggering said thyristor for rendering it conductive whereby a pulse is generated across said utilization circuit, said starting means including a gate terminal connected to said thyristor and adapted to receive electric energy for triggering said thyristor, said switch circuit being characterized in that it further comprises means for reducing the width of said pulse, said means including a pulse forming network comprising a low inductance connected to a chain of essentially similar circuits each including a capacitance connected in series with a high inductance, and each of said essentially similar circuits having a shunt path connected across its respective high inductance.

10. A switch circuit in accordance with claim 9 wherein each of said shunt paths includes a diode connected therein.

11. A switch circuit having a thyristor adapted for generating a pulse of electric energy, said switch circuit comprising a resonant turn-off circuit including a serially connected capacitor and inductor adapted for producing at least one cycle of ringing current for turning off said thyristor for effecting the termination of the generation of said pulse, said one cycle of ringing current comprising a first half-cycle and a second half-cycle, said switch circuit being characterized in that it includes means for reducing the on-off time interval of said thyristor for effecting a reduction in the width of said pulse, said means including a second inductor connected in series with said first-mentioned inductor, said second inductor having an inductance value that is different from the inductance value of said first inductor, and an instrumentality for shunting one of said inductors, said instrumentality being responsive to only one of said half-cycles.

12. A switch circuit in accordance with claim 11 wherein said one half-cycle is said second half-cycle, wherein said instrumentality is a diode, and wherein said shunted inductor is that one of said inductors having the higher inductance value.

References Cited

UNITED STATES PATENTS

| | | | |
|---|---|---|---|
| 3,138,722 | 6/1964 | Morgan | 307—252 |
| 3,205,378 | 9/1965 | Kline | 307—252 X |
| 3,229,150 | 1/1966 | Greep et al. | 307—252 X |
| 3,315,124 | 4/1967 | Boeker | 307—284 X |

DONALD D. FORRER, Primary Examiner

J. ZAZWORSKY, Assistant Examiner

U.S. Cl. X.R.

307—252, 265, 274, 305; 315—340